United States Patent
Shin et al.

(10) Patent No.: US 9,152,553 B1
(45) Date of Patent: Oct. 6, 2015

(54) GENERIC COMMAND DESCRIPTOR FOR CONTROLLING MEMORY DEVICES

(71) Applicant: MARVELL INTERNATIONAL LTD., Hamilton (BM)

(72) Inventors: Hyunsuk Shin, San Jose, CA (US); Chi Kong Lee, Fremont, CA (US); Chih-Ching Chen, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 283 days.

(21) Appl. No.: 13/711,596

(22) Filed: Dec. 11, 2012

Related U.S. Application Data

(60) Provisional application No. 61/576,312, filed on Dec. 15, 2011.

(51) Int. Cl.
*G06F 12/00* (2006.01)
*G06F 12/02* (2006.01)
*G06F 3/06* (2006.01)

(52) U.S. Cl.
CPC .......... *G06F 12/0246* (2013.01); *G06F 3/0604* (2013.01); *G06F 3/0629* (2013.01); *G06F 3/0679* (2013.01); *G06F 2212/72* (2013.01)

(58) Field of Classification Search
None
See application file for complete search history.

(56) References Cited

U.S. PATENT DOCUMENTS

| | | | | | |
|---|---|---|---|---|---|
| 3,950,730 | A | * | 4/1976 | Bienvenu et al. | 711/173 |
| 4,133,030 | A | * | 1/1979 | Huettner et al. | 711/170 |
| 4,604,695 | A | * | 8/1986 | Widen et al. | 711/217 |
| 5,651,139 | A | * | 7/1997 | Cripe et al. | 711/163 |
| 6,029,226 | A | * | 2/2000 | Ellis et al. | 711/100 |
| 2002/0059588 | A1 | * | 5/2002 | Huber et al. | 725/35 |
| 2002/0103943 | A1 | * | 8/2002 | Lo et al. | 710/2 |
| 2004/0148460 | A1 | * | 7/2004 | Steinmetz et al. | 711/114 |
| 2006/0224396 | A1 | * | 10/2006 | Le Cam | 705/1 |
| 2007/0088864 | A1 | * | 4/2007 | Foster | 710/22 |
| 2010/0115152 | A1 | * | 5/2010 | Day et al. | 710/22 |
| 2010/0306857 | A1 | * | 12/2010 | Shim et al. | 711/102 |
| 2011/0066882 | A1 | * | 3/2011 | Walls et al. | 711/170 |

OTHER PUBLICATIONS

Seagate Tech. LLC. "SCSI Commands Reference Manual." Pub. No. 100293068, Rev. D, 2010.*
busTRACE Techs. LLC. "busTRACE 6.0 User's Manual." 2006, available at <http://web.archive.org/web/20061110061803/http://www.bustrace.com/bustrace6/manual/HTML/08_cdbs/1_intro.htm>.*

* cited by examiner

*Primary Examiner* — Kevin Verbrugge

(57) ABSTRACT

The present disclosure includes systems and techniques relating to controlling memory devices with a generic command descriptor. In some implementations, an apparatus, systems, or methods can include a memory controller including an interface configured to connect with a NAND memory device and circuitry configured to receive a descriptor of a command sequence including multiple segments for managing the NAND memory device. The descriptor can include option information corresponding to each segment of the command sequence. The circuitry can also be configured to generate the command sequence for managing the NAND memory device based, at least in part, on the option information of the descriptor.

18 Claims, 7 Drawing Sheets

GENERIC COMMAND DESCRIPTOR FOR CONTROLLING MEMORY DEVICES

CROSS REFERENCE TO RELATED APPLICATIONS

This application claims priority to U.S. Provisional Application Ser. No. 61/576,312 titled "GENERIC COMMAND DESCRIPTOR TO CONTROL NAND FLASH MEMORY," filed on Dec. 15, 2011, the disclosure of which is incorporated herein by reference in its entirety.

TECHNICAL FIELD

The subject matter of this application is generally related to controlling memory devices using commands having command descriptors.

BACKGROUND

Many electronic devices include embedded systems with central processor units (CPUs) to control the operation of the devices providing greatly enhanced functionality and operational flexibility. Typically, non-volatile memory is included as a portion of the embedded system to store operating system program code and data for operating the embedded system. Recently, embedded systems have begun to use flash memory for the non-volatile memory. Flash memory may advantageously be efficiently reprogrammed while also providing non-volatile storage of information.

Flash memory devices can be controlled by command sequences describing, for example, read, write, or erase operations. The command sequences for controlling flash memory devices that are fabricated by different flash memory device manufacturers may differ based on the requirements and specification of the respective manufacturer. The hardware (e.g., a memory controller) that generates and executes command sequences to access flash memory devices is generally adapted to the configuration of command sequences as required by the respective flash memory manufacturer.

SUMMARY

The present disclosure includes systems and techniques relating to controlling memory devices with a generic command descriptor. According to an aspect of the described systems and techniques, a memory controller includes an interface configured to connect with a NAND memory device and circuitry configured to receive, from firmware, a descriptor of a command sequence including multiple segments for managing the NAND memory device, where the descriptor includes option information corresponding to each segment of the command sequence, and to generate the command sequence for managing the NAND memory device based, at least in part, on the option information of the descriptor.

In some implementations, the option information can include an indicator to combine two or more descriptors, and the circuitry can be further configured to associate the two or more descriptors based on the indicator, and to generate the command sequence based on the combined two or more descriptors. In some implementations, the command sequence for managing the NAND memory device can be based on a template. In some implementations, the circuitry can be further configured to cause at least one of a read, write, or erase operation based on the command sequence. In some implementations, at least some of the segments can define one of a command, address, or data.

According to another aspect of the described systems and techniques, a method can include receiving, at a memory controller, a descriptor of a command sequence including multiple segments for managing a NAND memory device, where the descriptor includes option information corresponding to each segment of the command sequence, and generating the command sequence for managing the NAND memory device based, at least in part, on the option information of the descriptor.

In some implementations, the option information can include an indicator to combine two or more descriptors, and generating the command sequence for managing the NAND memory device can further include associating the two or more descriptors based on the indicator and generating the command sequence based on the combined two or more descriptors. In some implementations, the command sequence for managing the NAND memory device can be based on a template. In some implementations, managing the NAND memory device can include causing at least one of a read, write, or erase operation based on the command sequence. In some implementations, at least some of the segments can define one of a command, address, or data.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a system can include a NAND memory device, a processing device including a hardware processor and firmware configured to construct a descriptor of a command sequence, and a memory controller configured to: receive, from the processing device, the descriptor of the command sequence for managing the NAND memory device, where the command sequence includes multiple segments, and the descriptor includes option information corresponding to each segment of the command sequence, and to generate the command sequence for managing the NAND memory device based, at least in part, on the option information of the descriptor. The described systems and techniques described in this specification can be implemented so as to realize one or more of the following advantages. This technology can implement a generic descriptor for controlling flash memory devices eliminating the need to modify or reconfigure hardware components, such as a memory controller, to access flash memory devices that require different command sequences.

Details of one or more implementations are set forth in the accompanying drawings and the description below. Other features, objects and advantages may be apparent from the description and drawings, and from the claims.

DRAWING DESCRIPTIONS

Like reference symbols in the various drawings indicate like elements.

DETAILED DESCRIPTION

The systems and techniques described herein can be implemented as one or more devices, such as one or more integrated circuit (IC) devices, in an electronic data storage device.

The use of memory devices, such as flash electrically erasable programmable read only memory (EEPROM), is becoming more widespread. For example, jump drives, memory cards, and other non-volatile memory appliances are commonplace in cameras, video games, computers, and other electronic devices. In some implementations, the flash memory may be a "NAND" type flash memory. NAND flash memory generally has faster erase and write times, higher density, lower cost per bit, and more endurance than NOR-type flash memory.

Operations, such as read, write, and/or erase associated with flash memory devices are generally controlled by a command sequence that defines the respective operation (e.g., a sequence of commands, addresses, data, and time). The command sequence can be defined by a descriptor that is interpreted by a system or memory controller in order to access and perform operations with the respective flash memory device. The memory controller can be a central processor unit (CPU), a solid state drive controller, a solid state memory controller, a memory control module, or any other device configured to manage memories.

Flash memory devices fabricated by different manufacturers may require a different command sequence to perform an operation. For example, some flash memory manufacturers may require a different number of commands and addresses or different timing to perform an operation than others. Consequently, the descriptor would have to reflect the particular configuration of the command sequence required by the respective flash memory device manufacturer.

A job/descriptor architecture may be used to increase parallelism by allowing each memory device to be operated separately. A job may be used to represent a read, write, or erase operation. When firmware wants to assign a job to a device, it may issue a descriptor, which may contain information about the target channel, the target device, the type of operation, etc. The firmware may provide descriptors without waiting for a response from a memory device, and several jobs may be issued continuously to form a job queue. After the firmware finishes programming descriptors, a sequencer may handle the remaining work so that the firmware may concentrate on other tasks.

Figure 1:
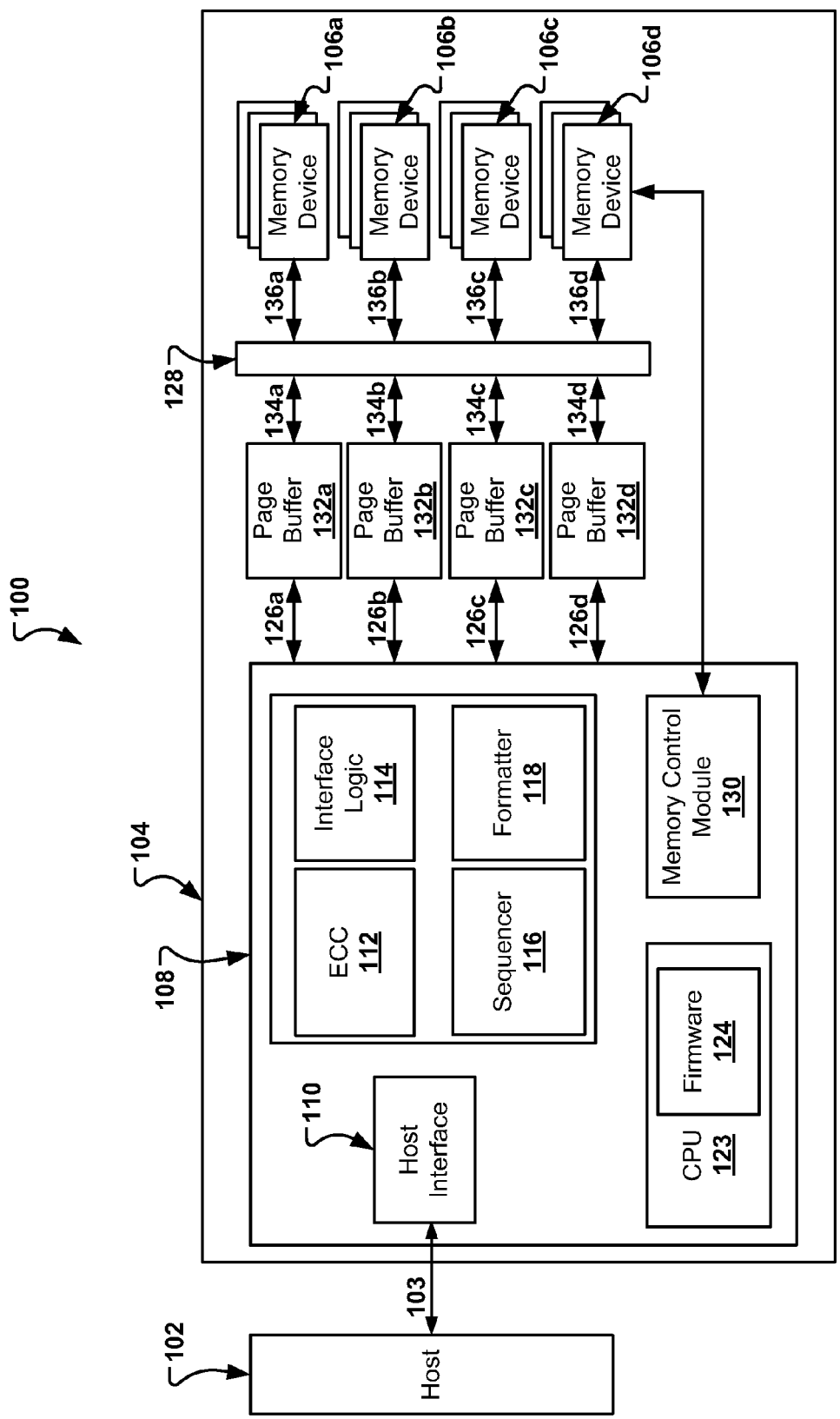
FIG. 1 shows an example of a solid state drive system.

FIG. 1 shows an example of a solid state drive system 100. As shown in FIG. 1, the system 100 can include a host 102 and a solid state drive system 104. The solid state drive system 104 can include a host interface 110, a central processor unit (CPU) 123, a memory interface 128, a memory control module 130 and memory devices 106*a*, 106*b*, 106*c* and 106*d* (e.g., flash memory devices).

The host 102 can communicate with the solid state drive system 104 through the host interface 110. The host interface 110, in some implementations, can include a Serial Advanced Technology Attachment (SATA) interface or a Parallel Advanced Technology Attachment (PATA) interface. A SATA interface or PATA interface can be used to convert serial or parallel data into parallel or serial data, respectively. For example, if the host interface 110 includes a SATA interface, then the SATA interface can receive serial data transferred from the host 102 through a bus 103 (e.g., a SATA bus), and convert the received serial data into parallel data. In other implementations, the host interface 110 can include a hybrid interface. In these implementations, the hybrid interface can be used in conjunction with, for example, a serial interface.

The host interface 110, in some implementations, can include one or more registers in which operating commands and addresses from the host 102 can be temporarily stored. The host interface 110 can communicate a program or read command to a solid state controller 108 in response to the stored information in the register(s).

As shown in FIG. 1, the solid state controller 108 can include the host interface 110, an error correction code (ECC) module 112, interface logic 114, a sequencer 116, a formatter 118, a CPU 123 containing embedded firmware 124 by which the solid state controller 108 can be controlled, and a memory control module 130. The CPU 123 can include a microprocessor, a signal processor (e.g., a digital signal processor) or microcontroller.

In some implementations, the solid state drive system 104 can include one or more channels 126*a*, 126*b*, 126*c* and 126*d*, and each channel 126*a*-126*d* can be configured to receive one or more control signals (e.g., four chip-enable signals) or read, program or erase data or commands from the host 102 or from the memory devices 106*a*-106*d*.

The solid state controller 108 can be configured to handle any suitable command, status, or control request for access to the memory devices 106*a*-106*d*. For example, the solid state controller 108 can be configured to manage and control storage and retrieval of data in the memory devices 106*a*-106*d*. To initialize a read, program or erase operation, the solid state controller 108 can receive one or more service requests or commands (e.g., read, program and erase requests) from the host 102 (or from the memory control module 130).

In some implementations, the solid state controller 108 can be a part of a microcomputer system under the control of a microprocessor (not shown). The solid state controller 108 can control the flow of commands and data between the host 102 and the solid state drive system 104. In some implementations, the solid state controller 108 can include read-only memory (ROM), random-access memory (RAM) and other internal circuits. The solid state controller 108, in some implementations, can be configured to support various functions associated with the memory devices 106a-106d, such as, without limitation, diagnosing the memory devices 106a-106d, sending commands (e.g., activation, read, program, erase, pre-charge and refresh commands) to the memory devices 106a-106d, and receiving status from the memory devices 106a-106d. Diagnosing the memory devices can include the identification of defective bit lines within the memory devices. The solid state controller 108 can be formed on a same or different chip as the memory devices 106a-106d. The solid state controller 108 also can be formed on a same or different chip as the solid state drive system 104.

The memory devices 106a-106d can be coupled with the memory interface 128. In some implementations, if the memory devices 106a-106d include NAND-type memory devices, the memory interface 128 can be a NAND flash input/output interface.

In some implementations, the solid state drive system 104 (and/or the host 102) can be mounted on a system on-chip (SOC). The SOC, in these implementations, can be fabricated using, for example, a digital process. The SOC can include an embedded process system (e.g., an embedded CPU) separate from the CPU 123 in the solid state drive system 104. The SOC also can include a SRAM (Static Random Access Memory), system logic, cache memory and cache controller for processing program code and data. The program code and data associated with the embedded process system can be stored in the memory devices 106a-106d, and communicated to the SOC through, for example, an SOC interface (not shown). The SOC interface can be used by a translator for translating information flowing between the interface and the internal bus structure of the SOC. Control signals can flow from the SOC to the memory devices 106a-106d while instructions and data can flow from the memory devices 106a-106d to the SOC during read operations. Instructions and data also can be sent to the memory devices 106a-106d during program operations.

The host 102 can communicate with the memory devices 106a-106d through the solid state controller 108. For example, the host 102 can transmit one or more commands to the solid state controller 108, and through the memory interface 128, the solid state controller 108 can send the host's commands to the memory devices 106a-106d. The memory interface 128 can be a NAND flash I/O interface. The NAND flash interface can include one or more pins each corresponding to a specific function, as will be discussed in greater detail below.

In some implementations, the memory devices 106a-106d can be controlled by the memory control module 130. The host 102 can communicate with the memory devices 106a-106d through the memory control module 130. The memory control module 130 can be connected to the memory devices 106a-106d through a corresponding pin or terminal. In these implementations, the memory control module 130 can be implemented as an application specific integrated circuit (ASIC) or as an SOC.

In some implementations, the memory devices 106a-106d can be coupled with a plurality of page buffers 132a, 132b, 132c and 132d. In some implementations, each memory device 106a-106d can be associated with a respective page buffer 132a-132d. For example, as illustrated in FIG. 1, the memory device 106a can be associated with the page buffer 132a; the memory device 106b can be associated with the page buffer 132b; the memory device 106c can be associated with the page buffer 132c; and the memory device 106d can be associated with the page buffer 132d. If desired, each memory device 106a-106d also can be associated with more than one page buffer.

In some implementations, the page buffers 132a-132d can be used as a temporary storage during program/read operations on the memory cells of the selected page. Each page buffer 132a-132d can have a storage capability at least equal to the storage capability of a memory page (e.g., 2 Kb).

Each page buffer 132a-132d can store one page of write data to be programmed into one page of memory cells. Each page buffer 132a-132d can include, without limitation, registers, sense circuits for sensing data read from one page of memory cells, verify logic, latching circuits or writing drivers. During program operations, each page buffer 132a-132d can latch program data received over a respective channel 126a-126d, and transfer the latched data to the respective memory device 106a-106d. Each page buffer 132a-132d also can perform program verify operations to ensure that the programmed data has been properly programmed into the memory devices 106a-106d.

As discussed above, the page buffers 132a-132d can be connected to the solid state controller 108 through respective channels 126a-126d. In some implementations, the page buffers 132a-132d also can be connected to the memory interface 128 through respective channels 134a, 134b, 134c and 134d, and to the memory devices 106a-106d through channels 136a, 136b, 136c and 136d. In some implementations, both the memory interface 128 and the page buffers 132a-132d can be formed as internal components of the solid state drive system 104 or the solid state controller 108. In other implementations, the page buffers 132a-132d can be formed as external components to the solid state drive system 104 or the solid state controller 108.

To select a particular page buffer 132a-132d for storing program data, input (e.g., user input or input provided by software programs) can be received through a double data rate (DDR) interface (not shown), which can be error-corrected by the ECC module 112. For read data, the ECC module 112 can be used to correct any error present in the READ data retrieved from the memory devices 106a-106d. For program data, the ECC module 112 can be used to add one or more redundant bits to the program data. Once the program data is written, the redundant bits allow error-correction to be performed in a subsequent read cycle of the written program data. The ECC module 112 can first select a set of data to be rewritten to the memory devices 106a-106d, add redundant data to the selected set of data, and pass the selected set of data with the redundant information to the memory devices 106a-106d through a corresponding channel 126a-126d (e.g., following a firmware request order issued by the firmware 124). Output of the ECC module 112 then can be used as a select signal to designate a page buffer 132a-132d for a particular program operation.

In some implementations, the memory devices 106a-106d can be multi-plane memory devices each including, for example, four planes. Each memory device 106a-106d also can include a non-volatile memory (e.g., a single-level flash memory or a multi-level flash memory). In some implementations, the non-volatile memory can include a NAND-type flash memory module. A NAND-type flash memory module can include a command/address/data multiplexed interface such that commands, data, and addresses can be provided through corresponding input/output pins. Advantages of using NAND-type flash memory devices as the memory devices 106a-106d include, without limitation, faster boot and resume times; longer battery life; and higher data reliability.

Each memory device 106a-106d can be connected to a respective channel 126a-126d. Each channel 126a-126d can support, for example, one or more input and output lines, chip select signal lines, chip enable signal lines and the like. The channel also can support other signal lines such as, without limitation, write enable, read enable, read/busy output, and reset signal lines. To increase the degree of parallelism, each memory device 106a-106d can have its own channel connected to the solid state drive system 104 as shown in FIG. 1. For example, memory device 106a can be connected to the solid state drive system 104 using channel 126a; memory device 106b can be connected to the solid state drive system 104 using channel 126b; memory device 106c can be connected to the solid state drive system 104 using channel 126c; and memory device 106d can be connected to the solid state drive system 104 using channel 126d. In other implementations, the memory devices 106a-106d can share a common channel.

The memory devices 106a-106d can be connected to the solid state drive system 104 via standard interfaces such as an Open NAND Flash Interface (OFNI). For the host-to-drive connection, standard connectors can be used that include, without limitation, SATA, USB (Universal Serial Bus), SCSI (Small Computer System Interface), PCMCIA (Personal Computer Memory Card International Association), and IEEE-1394 (Firewire).

Each memory device 106a-106d can include one or more dies (e.g., flash dies), each being selected using a chip enable signal or chip select signal. A solid state storage die can be partitioned into planes, blocks and pages. In some implementations, a page can have a capacity of 2 Kbytes, 4 Kbytes, 8K bytes or 16 KB. In some implementations, each die can be configured as a single bit cell (SLC) or multi-level cell (MLC), with a corresponding command.

Where multiple dies are used, in some implementations, the solid state drive system 104 can access more than one die in a same memory device at the same time. The solid state drive system 104 also can access different dies in different memory devices at the same time. The capability to access more than one die allows the solid state drive system 104 to fully utilize the available resources and channels 126a-126d to increase the overall performance of the solid state drive system 104. Further, where the memory devices 106a-106d share a same memory input/output line and control signal (e.g., chip enable signal), the number of pins of the solid state controller 108 can be reduced to further minimize the cost for manufacturing the solid state drive system 104.

A memory array of a memory device 106a-106d can typically be organized into bits, bytes, or pages. For example, a page can include a user portion containing 2 k bytes (or 2 kB), and a spare portion containing 64 bytes. The memory array further can be organized into blocks. For example, each block can contain 128 pages.

Each of the memory devices 106a-106d can be a multi-plane NAND flash memory device. NAND flash memory devices generally have higher density and lower cost per bit than NOR-type flash memory devices. A NAND flash memory can be coupled with a NAND flash I/O interface that allows sequential access to data. A NAND flash I/O interface can include multiple pins each corresponding to a specific function.

A bit, either a zero-bit or a one-bit, can generally be stored in a cell of the memory device 106a-106d. A cell is a memory element containing values of one or more data bits. A single-level cell (SLC) stores only one bit of data whereas a multi-level cell (MLC) can store more than one bit by choosing between multiple levels of electrical charge to apply to the floating gate of the cell. For example, while a SLC can be programmed with a logical value of "1" or "0", a MLC can be programmed with a logical value of "11", "10", "01", or "00".

In some implementations, the firmware 124 can be used to construct a descriptor defining a command sequence for controlling the memory devices 106a-d. For example, the descriptor can be constructed to describe a command sequence defining an operation (e.g., read, write, or erase) for a memory device. As mentioned above, the configuration of command sequences may vary based on the requirements of the memory device manufacturer. The descriptor can be provided to a memory controller that is managing the memory devices 106a-d, such as memory control module 130.

The memory controller can receive and decode the descriptor and generate a command sequence for controlling the respective memory device. The command sequence can be a protocol between the memory controller and the memory device. In some implementations, the command sequence includes several command, address, and/or data segments. Command, address, and/or data segments can be configured in many of multiple combinations in accordance with a given memory device.

Figure 2:
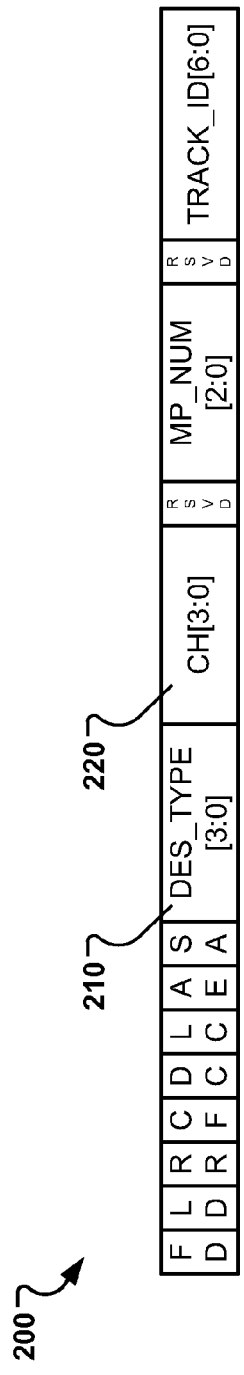
FIG. 2 shows an example of a descriptor for controlling flash memory devices.

FIG. 2 shows an example of a descriptor 200 for controlling flash memory devices. The descriptor can include a command type field 210 that describes the operation (e.g., program, read, erase, multiplane program, multiplane read, multiplane erase, etc.) to be performed with the flash memory device and a memory device channel 220. The command type field 210 can include a value designated for a specific predefined operation, for example, a value 000b can invoke a read operation (e.g., 00h-5B_ADDR-30h-tR-DATA), a value 0001b can invoke a program operation (e.g., 80h-5B_ADDR-DATA-10h-tPROG), or a value 0110b can invoke a multiplane erase operation (e.g., 60h-3B_ADDR-60h-3B_ADDR-D0h-tBERS).

The descriptor, which includes the command type field 210 and memory device channel 220, can be provided to the memory controller (e.g., memory control module 130) and the memory controller can decode the descriptor and generate a command sequence based on the operation specified in the command type field 210. The command sequence can be a combination of command, address, and data segments configured to the requirements of a particular flash memory device.

With the above implementation, the flash memory control can be abstracted into a short command type (e.g., specified by 4 bits) that is easy to use and does not need much knowledge about the flash memory device, because the command sequence corresponding to a command type 210 is predefined in the memory controller. Thus, the firmware can identify the desired operation in the descriptor and upon decoding the descriptor, the memory controller generates the corresponding command sequence. However, the flash memory command sequence can be dissimilar for different flash memory devices (e.g., different manufacturer specifications).

In such cases, where the command sequences corresponding to flash memory device operations are predefined in the hardware (e.g., the memory controller), it may be necessary to configure the hardware in accordance with a given memory device (e.g., based on the manufacturer specification). The customization of the hardware for managing flash memory devices can become challenging considering the wide variety of flash memory devices available in the market.

In some implementations, the descriptor can include option information (e.g., an option field) that enables dynamic modification or customization of each segment of the command sequence, such that many different configurations or combinations of command sequences can be generated. Thus, the memory controller can generate command sequences for many different flash memory devices regardless of the specific command sequence requirements of a given flash memory device. Several segments can be connected to form a command sequence that is required to control the operations of a flash memory device. The option information (e.g., a 128 bit data set) can be associated with each respective segment of the command sequence.

The segments of the command sequence can be associated with option information (e.g., an option field) to control the respective segment. The memory controller can decode the descriptor including the option information and generate a command sequence corresponding to the option information of the descriptor.

The command sequence configuration of a given flash memory device (e.g., defined by manufacturer specification) can be known to the firmware (e.g., a programmer can encode the command sequence configurations for flash memory devices into the firmware). The firmware can be informed of the flash memory devices connected to the system and construct descriptors corresponding to the connected flash memory devices by setting the option information accordingly. Thus, the implementation of such a generic descriptor can provide flexibility to the control of flash memory devices without changes to the hardware (e.g., the memory controller).

Figure 3:
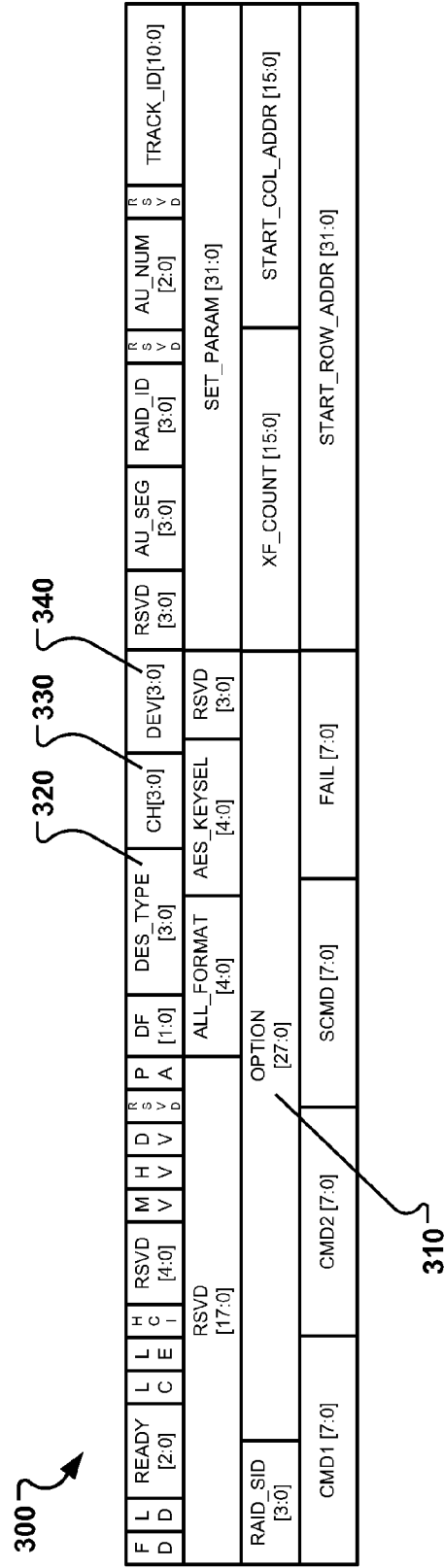
FIG. 3 shows an example of a descriptor including option information for controlling flash memory devices.

FIG. 3 shows an example of a descriptor 300 including option information 310 for controlling flash memory devices. With the option information 310 the firmware can define addresses, set command bits, set values for addresses or commands, change the number of addresses (e.g., 1, 2, or 4 bit address), disable or enable commands or addresses, etc. This can provide the flexibility required to access and manage flash memory devices with different command sequence configurations without changing hardware (e.g., the memory controller).

In some implementations, descriptor 300 can include a command type field 320, a memory device channel 330 and a memory device selector 340. The command type field 320 can define the operation to be performed by the flash memory device, such as read, write, erase, or multi-LUN. The memory device channel 330 and memory device selector 340 can identify the target flash memory device for the operation within the system.

For example, in order to execute an erase operation, flash memory device X may require a command sequence including the segments CMD1-ADDR1-CMD2-ADDR2-CMD3, and flash memory device Y may require a command sequence including the segments CMD1-CMD2-ADDR2-CMD3. The firmware can construct a descriptor to execute the erase operation in the flash memory devices X and Y by modifying a generic descriptor using the option information.

For example, a generic descriptor can be configured with three commands and two addresses. For device X, the firmware would construct a descriptor including the three commands, CMD1, CMD2, and CMD3, and the two addresses ADDR1 and ADDR2, of the generic descriptor. For device Y however, using the full generic descriptor may produce an incorrect command sequence, because the generic descriptor includes more address segments than required by device Y. With the option information, the firmware can disable the ADDR1 segment of the generic descriptor to construct a descriptor for the erase operation of flash memory device Y. The memory controller can receive the descriptors for flash memory devices X and Y and generate the corresponding command sequences for the erase operation.

In some implementations, common command sequences for the different operations can be described in templates. For example, a template can be configured to represent the most common command sequence for a particular operation (e.g., read, write, erase). By including option information in the descriptor, the template can be configured to comply with the command sequence required by a flash memory device. For example, command or address segments can be disabled, values for command or address segments can be set, time delays can defined, status reporting can be initiated, etc.

Figure 4:
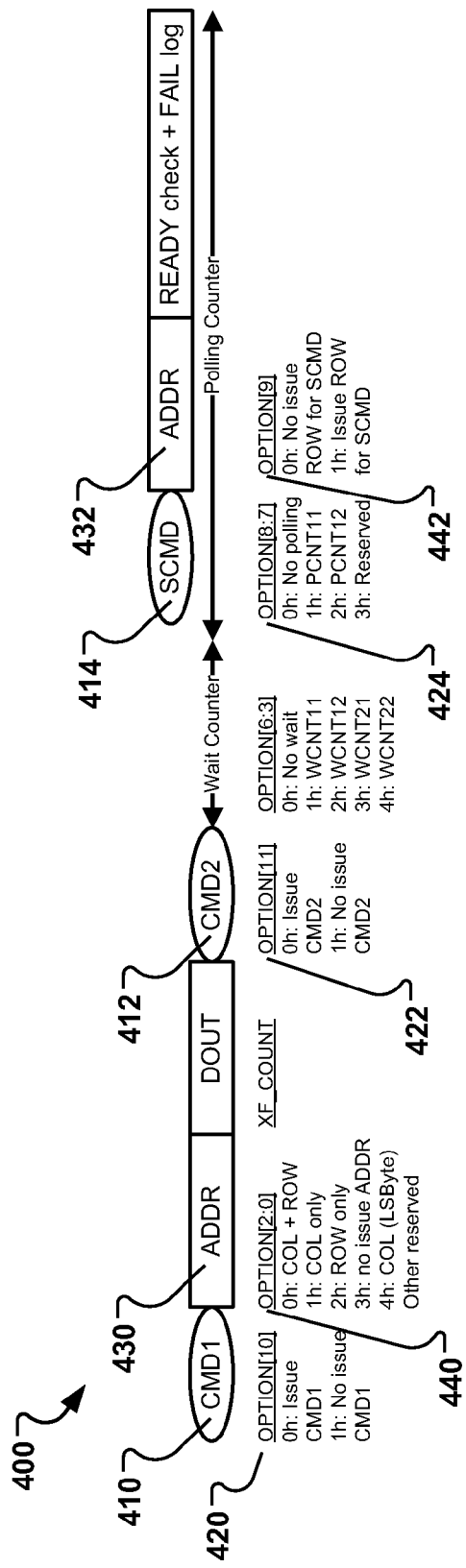
FIG. 4 shows an example of a command sequence including option information for a program operation.

FIG. 4 shows an example of a command sequence 400 including option information for a program operation for a flash memory device. Each segment of the command sequence can be associated with option information. The option information can include a number of bits (e.g., 128 bits) to define the type of segment (e.g., command, address, data, chain, etc.) in the command sequence. For example, command segments 410, 412, and 414 can be associated with option information bits 420 (e.g., 10), 422 (e.g., 11), and 424 (e.g., 8:7) respectively. Address segments 430 and 432 can be associated with option information bit 440 (e.g., 2:0) and 442 (e.g., 9) respectively.

Every option information bit can include a bit value to define the activity of the respective segment. For example, option information bit 420 can be set to a bit value 0h or 1h, causing the command segment 410 to be active or disabled. Option information bit 440 can be set to a bit value 0h, 1h, 2h, 3h, or 4h to define the column and row configuration, or to disable the address segment 430.

Figure 5:
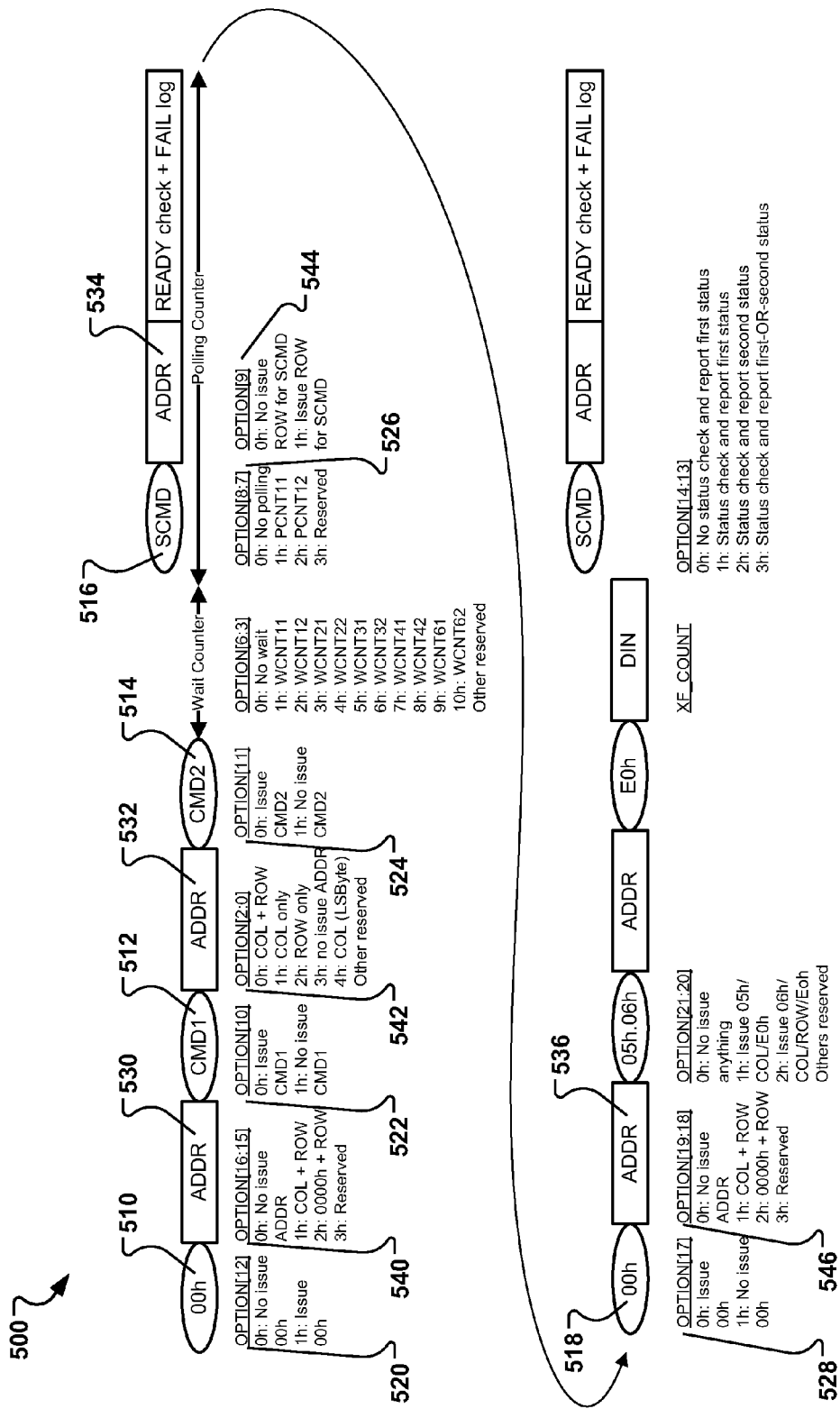
FIG. 5 shows an example of a command sequence including option information for a read operation.

FIG. 5 shows an example of a command sequence 500 including option information for a read operation for a flash memory device. This example shows a longer and more complex commence sequence for a flash memory device. For example, command segments 510, 512, 514, 516, and 518, can be associated with option information bits 520 (e.g., 12), 522 (e.g., 10), 524 (e.g., 11), 526 (e.g., 8:7), and 528 (e.g., 17) respectively. Address segments 530, 532, 534, and 536 can be associated with option information bits 540 (e.g., 16:15), 542 (e.g., 2:0), 544 (e.g., 9), and 546 (e.g., 19:18) respectively.

As described above, the firmware can construct a descriptor including option information and provide the descriptor to a memory controller configured to access and manage flash memory devices. With the option information included in the descriptor, the memory controller can generate many different combinations and configurations of command sequences, regardless of the flash memory device requirements.

In some implementations, the flash memory device may require a long or complex command sequence that cannot be generated by an individual generic descriptor. For example, a generic descriptor may include three command segments and two address segments, and thus can be used to generate any combination of three commands or less and two addresses or less. If a flash memory device requires, for example, ten command segments, the individual generic descriptor would not be able to generate the command sequence including the ten command segments. The option information of the descriptor can include an indicator (e.g., a designated option information bit or chain bit) that causes the memory controller to chain several descriptors together and to generate a command sequence including all segments required by the flash memory device (e.g., by combining command sequences based on the chained descriptors).

The command sequence requirements of the different flash memory devices can be known to the firmware. The firmware can construct a descriptor to create long or complex command sequences by chaining multiple generic descriptors 'tightly' together for example by setting an option information bit, or chain bit, designated to the chain feature in the option information (e.g., bit 23). By constructing a 'tight' chain of descriptors, it can be avoided that the individual descriptors are separated when the command sequence is generated from the associated descriptors. The bit value of the option information bit designated to the chain feature can define the activity, for example, a bit value of 0 for 'no chain', or 'end of chain', or a bit value of 1 for a 'tight chain with the next descriptor'.

In some implementations, the memory controller can verify whether the next descriptor is the same VOL/CE/LUN. The firmware can control the CE assertion chain, for example, by setting an option information bit (e.g., bit 24) in the generic descriptor. For example, a bit value of 0 can cause the CE to toggle between the memory controller commands, and a bit value of 1 can cause the CE to stay active between the memory controller commands of the current descriptor and the next descriptor. In some implementations, for ONFI sync devices, NF CLK toggle should be set to avoid tCKH violation.

The end of a descriptor chain can be indicated by the bit value of the option information bit designated to the chain feature (e.g., a bit value of 0). In some implementations, a read descriptor invoking a read operation of data from the flash memory device, should not be set as the beginning or middle of a descriptor chain to avoid a deadlocking relationship with other read descriptors since the memory controller may attempt to keep the read data order among multiple descriptors.

The memory controller can generate and execute a continuous command sequence from the tightly chained descriptors to support custom command sequences as required to control particular flash memory devices.

In the above example, the option information of the descriptor would cause the memory controller to chain four descriptors together in order to generate a command sequence with ten command segments (i.e., three descriptors with 3 command segments enabled and one descriptor with 1 command segment enabled).

In some implementations, the memory controller can operate multiple flash memory devices of a system separately and in parallel. The memory controller can be configured to treat the multiple flash memory devices as independent entities, and thus, each descriptor can be considered an independent command. The memory controller may submit command sequences to several flash memory devices in an order, which can be determined by an algorithm, for example, based on efficiency, performance, access time, available system resources, memory device status, etc.

The order in which the multiple flash memory devices are accessed by the memory controller can be based on complex algorithms supporting operation of multiple flash memory devices in parallel. Without considering the chain feature in the option information, the memory controller would submit the command sequences generated from the individual descriptors in an order determined by the algorithm, which may break a long or complex command sequence for a flash memory device that is defined in multiple descriptors.

When the memory controller generates a command sequence from multiple descriptors that are tightly chained together, the memory controller can give priority to the descriptor chain over the algorithm determining the order in which the flash memory device should be accessed, to ensure that the command sequence for the flash memory device is not broken. For example, a system may include three flash memory devices, device A, B, and C, where device A requires a command sequence with four command segments, device B requires a command sequence with three command segments, and device C requires a command sequence with ten command segments. The generic descriptor, which is customizable through option information, can accommodate, for example, four command segments.

In this example, the memory controller can generate the command sequence for device A and device B from a single generic descriptor, because device A requires four command segments and device B requires three command segments, both of which can be configured by the four command segments of the single generic descriptor. Since the generic descriptor only accommodates four command segments, three of the generic descriptors can be used to generate the command sequence for device C, which uses ten command segments (e.g., descriptor 1: 4 command segments, descriptor 2: 4 command segments, and descriptor 3: 2 command segments).

If the memory controller issues the command sequences for the devices A, B, and C based on the algorithm described above or other criteria, it is possible that the command sequence for device C, which uses three descriptors, is separated by an intervening command sequence for device A or B. For example, if the memory controller issues the command sequence for device A followed by the first part of the command sequence for device C, but then issues the command sequence for device B because of the algorithm, the interfering command sequence for device B could break the first and second part (descriptor 1 and descriptor 2) of the command sequence for device C.

In order to avoid the separation of continuous command sequences as appropriate for the flash memory device, such as device C, the descriptors can be chained tightly together, for example, by setting an option information bit designated to the chain feature (e.g., a chain bit) in the option information of the descriptors to be chained together to generate the continuous command sequence.

Figure 6:
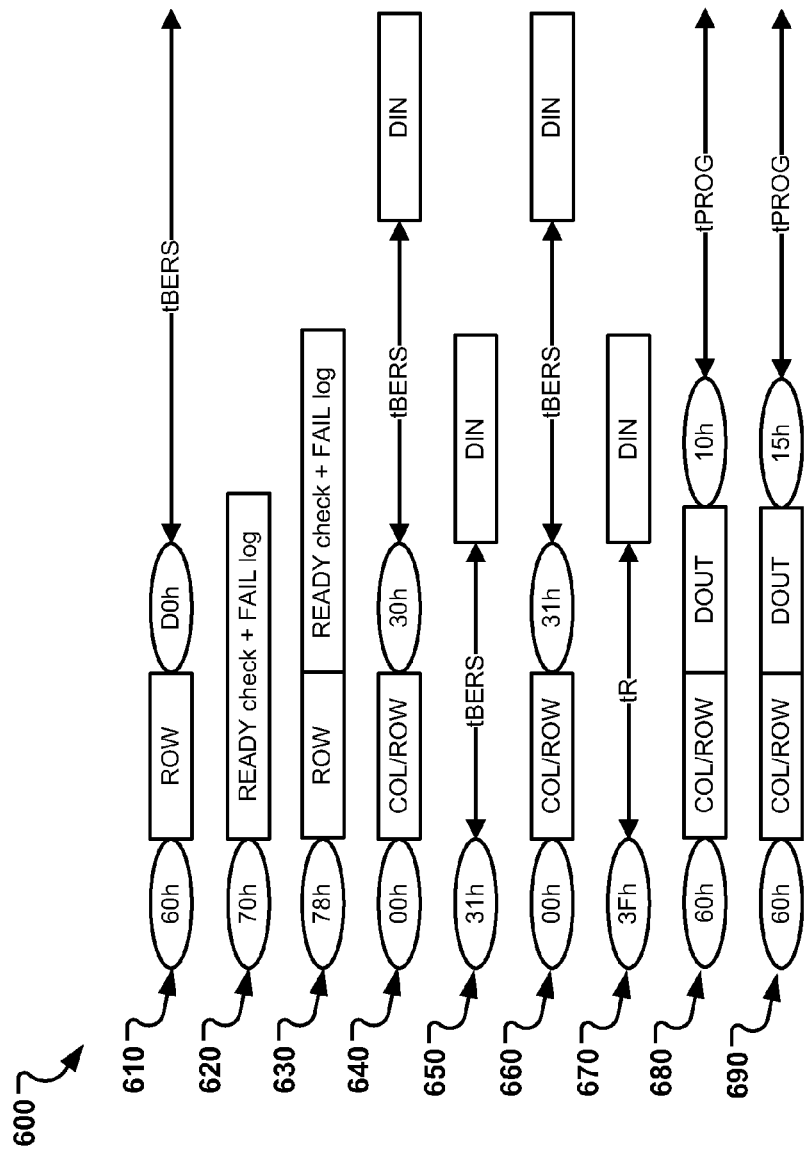
FIG. 6 shows examples of command sequences for controlling flash memory devices.

FIG. 6 shows examples of command sequences 600 for controlling flash memory devices. Command sequence 610 shows an example command sequence for an erase operation including two command segments, one address segment and one time segment. Command sequence 620 shows an example command sequence for a read status operation including one command segment and one check and log segment. Command sequence 630 shows an example command sequence for a read status enhanced operation including one command segment, one address segment and one check and log segment. Command sequence 640 shows an example command sequence for a read operation including two command segments, one address segment, one time segment, and one data segment. Command sequence 650 shows an example command sequence for a read cache sequential operation including one command segment, one time segment, and one data segment. Command sequence 660 shows an example command sequence for a read cache random operation including two command segments, one address segment, one time segment, and one data segment. Command sequence 670 shows an example command sequence for a read cache end operation including one command segment, one time segment, and one data segment. Command sequence 680 shows an example command sequence for a program operation including two command sequences, one address segment, one data segment, and one time segment. Command sequence 690 shows an example command sequence for a program cache operation including two command sequences, one address segment, one data segment, and one time segment.

Figure 7:
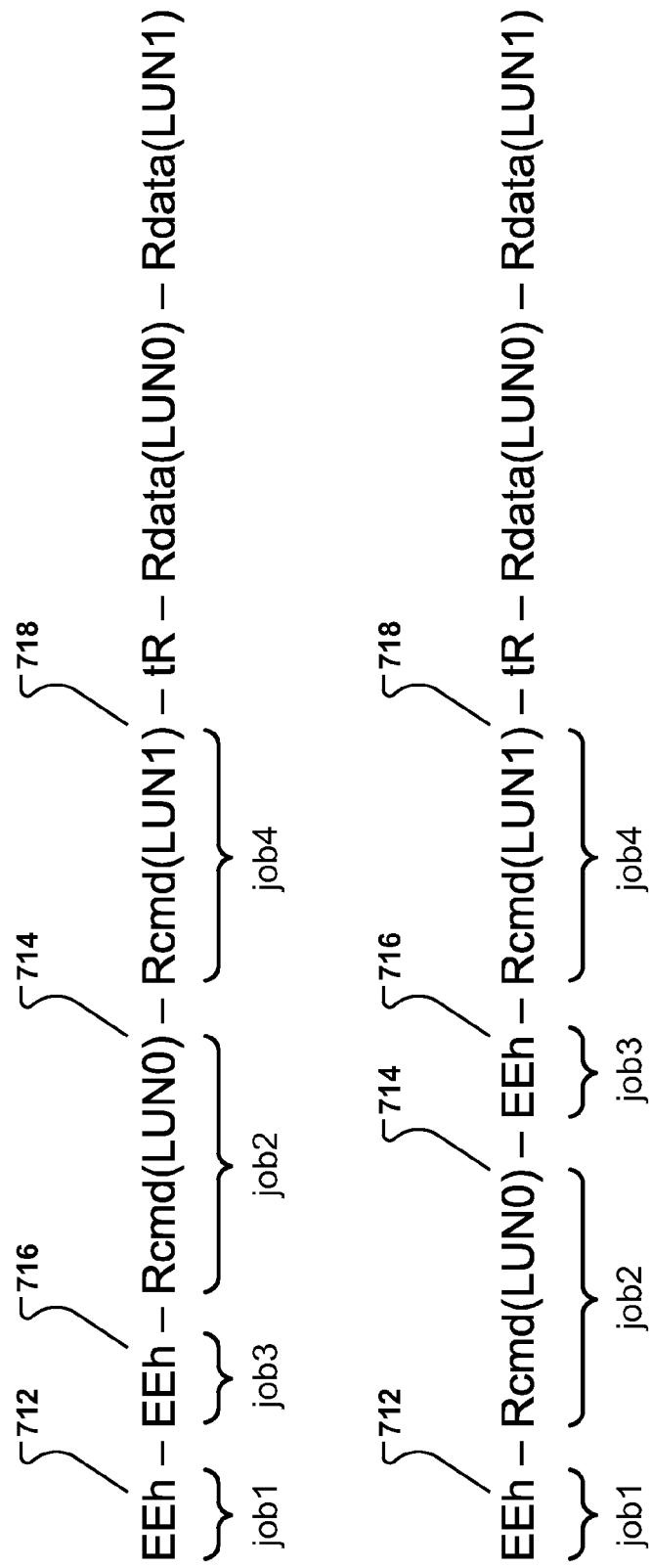
FIG. 7 shows an example of chaining multiple descriptors together in order to generate a continuous command sequence.

FIG. 7 shows an example of chaining multiple descriptors together in order to generate a continuous command sequence. In this example, a command sequence is generated by the memory controller using four different descriptors, descriptor 712, 714, 716, and 718. Job 1 processes descriptor 712, job 2 processes descriptor 714, job 3 processes descriptor 716, and job 4 processes descriptor 718. Since the memory controller can be configured to treat multiple flash memory devices as independent entities and can consider each descriptor as an independent command, an algorithm that determines the order of jobs to be processed would also define the order in which the descriptors are generated and executed.

In this example, an algorithm defining the order in which the descriptors should be processed, as described above, may determine that the descriptors should be processed in the order of job 1, job 3, job 2, and job 4. This order may be the preferred order based on the algorithm, but would break the chain of descriptors and the memory controller would generate and execute an incorrect command sequence. To avoid the generation and execution of an incorrect command sequence, the descriptor can include option information (e.g., a chain bit) designating the descriptors 712, 714, 716, and 718 as tightly chained together.

When decoding the descriptors including the option information, the memory controller can recognize that the descriptors are tightly chained together and prioritize the order of the descriptors over the order suggested by the algorithm. Thus, the memory controller would generate and execute the correct command sequence based on the order of the tightly chained descriptors.

Figure 8:
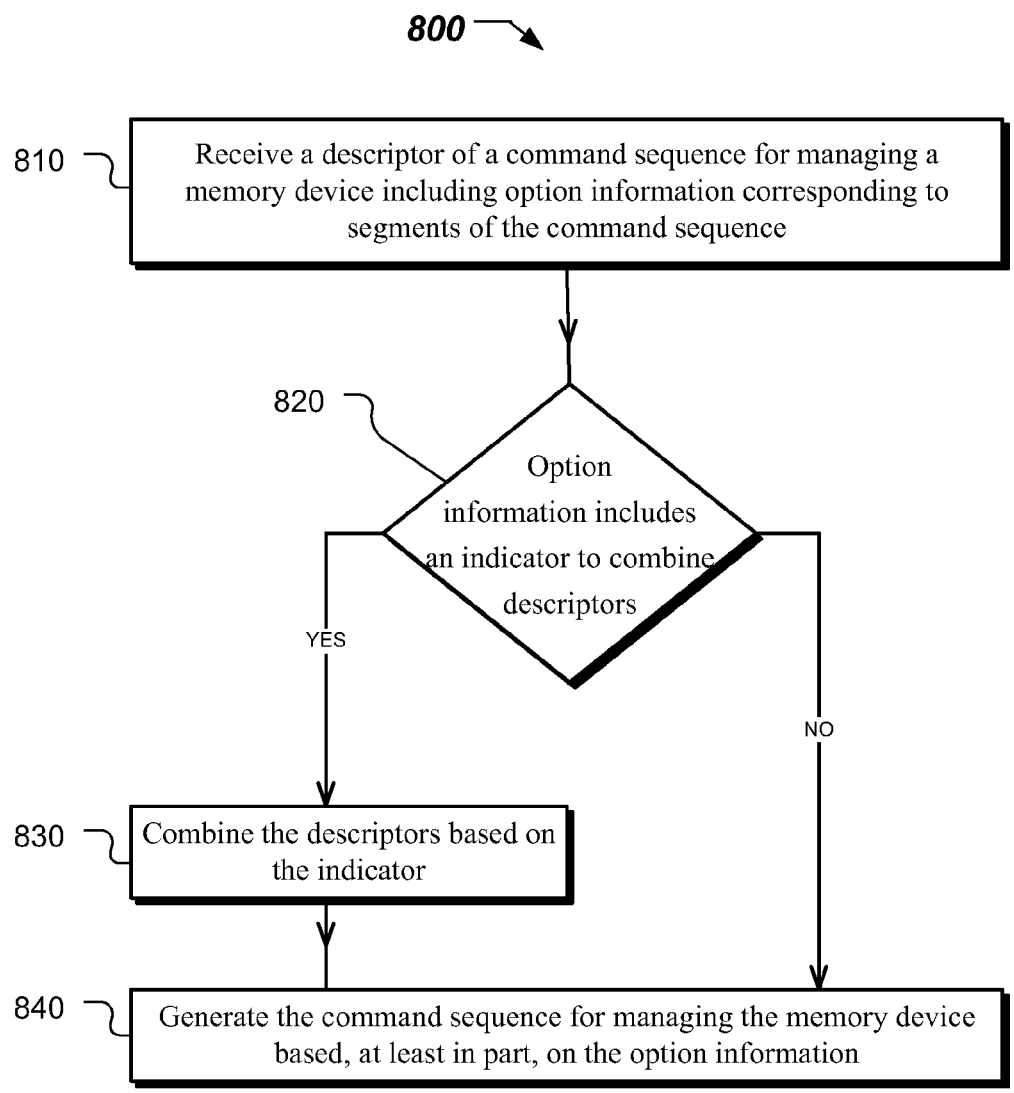
FIG. 8 shows an example of a process for controlling memory devices with descriptors including option information.

FIG. 8 shows an example of a process 800 for controlling memory devices with descriptors including option information. At 810, a descriptor can be received by a memory controller (e.g., memory control module 130) for managing a flash memory device. The memory controller can decode the descriptor and generate a command sequence to access and manage the flash memory device. The descriptor can include option information that corresponds to individual segments of the command sequence. The option information can include option information bits defining the individual segments of the command sequence (e.g., command, address, data, or chain). The option information bit can include a bit value that can control the individual segments of the command sequence (e.g., enable, disable, set value).

At 820, the memory controller determines whether the option information includes an indicator to associate multiple descriptors to generate a continuous command sequence (e.g., by combining multiple command sequences). The indicator can be an option information bit (e.g., a chain bit). If the option information includes an indicator to associate multiple descriptors, at 830, the memory controller can associate the multiple descriptors. At 840, the memory controller can generate a command sequence to control and manage the flash memory device based, at least in part, on the option information of the descriptor. If multiple descriptors are associated, the memory controller can generate a continuous command sequence based on the option information of the associated descriptors.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

The implementations described above can also be implemented for other types of non-volatile or persistent memory, which may not be solid state.

What is claimed is:

1. A memory controller comprising:
an interface configured to connect with a NAND memory device; and
circuitry configured to
receive, from firmware, a descriptor of a command sequence, the command sequence for managing the NAND memory device, the command sequence comprising a plurality of segments, the plurality of segments including a command segment defining a command, the descriptor including option information corresponding to the command segment of the plurality of segments of the command sequence, and generate the command sequence for managing the NAND memory device including generate the command segment based, at least in part, on the option information of the descriptor.

2. The memory controller of claim 1, wherein the option information comprises an indicator to combine two or more descriptors, and the circuitry is further configured to:

associate the two or more descriptors based on the indicator; and generate the command sequence based on the combined two or more descriptors.

3. The memory controller of claim 2, wherein the indicator comprises an option information bit.

4. The memory controller of claim 1, wherein the command sequence for managing the NAND memory device is based on a template.

5. The memory controller of claim 1, wherein the circuitry is further configured to cause at least one of a read, write, or erase operation based on the command sequence.

6. The memory controller of claim 1, wherein the option information comprises 128 bits and wherein the circuitry is further configured to associate at least a portion of the 128 bits with at least a portion of the plurality of segments.

7. The memory controller of claim 6, wherein a bit value of the option information bits (i) activates, (ii) disables, or (iii) sets a value for a segment of the portion of the plurality of segments.

8. The memory controller of claim 1, wherein the plurality of segments include an address segment defining an address or a data segment defining data.

9. A method comprising:

receiving, at a memory controller, a descriptor of a command sequence, the command sequence for managing a NAND memory device, the command sequence comprising a plurality of segments, the plurality of segments including a command segment defining a command, the descriptor including option information corresponding to the command segment of the plurality of segments of the command sequence; and generating the command sequence for managing the NAND memory device including generating the command segment based, at least in part, on the option information of the descriptor.

10. The method of claim 9, wherein the option information comprises an indicator to combine two or more descriptors, and generating the command sequence for managing the NAND memory device further comprises:

associating the two or more descriptors based on the indicator; and generating the command sequence based on the combined two or more descriptors.

11. The method of claim 10, wherein the indicator comprises an option information bit.

12. The method of claim 9, wherein the command sequence for managing the NAND memory device is based on a template.

13. The method of claim 9, wherein managing the NAND memory device comprises causing at least one of a read, write, or erase operation based on the command sequence.

14. The method of claim 9, wherein the option information comprises 128 bits and wherein at least a portion of the 128 bits is associated with at least a portion of the plurality of segments.

15. The method of claim 14, wherein a bit value of the option information bits (i) activates, (ii) disables, or (iii) sets a value for a segment of the portion of the plurality of segments.

16. The method of claim 9, wherein the plurality of segments, includes an address segment defining an address or a data segment defining data.

17. A system comprising:

a NAND memory device;

a processing device including a hardware processor and firmware configured to construct a descriptor of a command sequence; and a memory controller configured to:

receive, from the processing device, the descriptor of the command sequence, the command sequence for managing the NAND memory device, the command sequence comprising a plurality of segments, the plurality of segments including a command segment defining a command, and the descriptor including option information corresponding to the command segment of the plurality of segments of the command sequence, and generate the command sequence for managing the NAND memory device including generate the command segment based, at least in part, on the option information of the descriptor.

18. The system of claim 17, wherein the plurality of segments includes an address segment defining an address or a data segment defining data.

* * * * *